(12) United States Patent
Kadowaki et al.

(10) Patent No.: US 8,460,501 B2
(45) Date of Patent: Jun. 11, 2013

(54) CURED FILM AND METHOD FOR PRODUCTION THEREOF

(75) Inventors: Yasushi Kadowaki, Kawasaki (JP); Ryoji Toita, Kawasaki (JP); Kenji Shimamura, Kawasaki (JP)

(73) Assignee: Showa Denko K.K., Tokyo (JP)

( * ) Notice: Subject to any disclaimer, the term of this patent is extended or adjusted under 35 U.S.C. 154(b) by 75 days.

(21) Appl. No.: 12/937,939

(22) PCT Filed: Apr. 13, 2009

(86) PCT No.: PCT/JP2009/057428
§ 371 (c)(1),
(2), (4) Date: Oct. 14, 2010

(87) PCT Pub. No.: WO2009/128415
PCT Pub. Date: Oct. 22, 2009

(65) Prior Publication Data
US 2011/0039117 A1   Feb. 17, 2011

(30) Foreign Application Priority Data
Apr. 14, 2008 (JP) ................................ 2008-104781

(51) Int. Cl.
*B32B 37/00* (2006.01)
*B32B 7/12* (2006.01)
*B32B 27/00* (2006.01)

(52) U.S. Cl.
USPC .......................... 156/275.5; 156/327; 156/332

(58) Field of Classification Search
None
See application file for complete search history.

(56) References Cited

U.S. PATENT DOCUMENTS 5,312,855 A * 5/1994 Okami ........................... 524/290
2007/0231592 A1 * 10/2007 Agata ............................ 428/522

FOREIGN PATENT DOCUMENTS

| JP | 04-141404 A | 5/1992 |
|----|-------------|--------|
| JP | 2003-213067 A | 7/2003 |
| JP | 2005-240028 A | 9/2005 |
| JP | 2006-010748 A | 1/2006 |
| JP | 2006-347054 A | 12/2006 |
| JP | 2007-057866 A | 3/2007 |
| JP | 2007-114270 A | 5/2007 |
| JP | 2007-268711 A | 10/2007 |
| JP | 2008-013690 A | 1/2008 |
| JP | 2008-081737 A | 4/2008 |

OTHER PUBLICATIONS

Notice of Reasons for Rejections issued in corresponding Japanese Patent Application No. 2010-508198, mailed Aug. 15, 2012.

* cited by examiner

*Primary Examiner* — Sheeba Ahmed
(74) *Attorney, Agent, or Firm* — Sughrue Mion, PLLC

(57) ABSTRACT

This invention relates to a method for producing a cured film, which comprises a first step of applying a curable resin composition onto a surface of a first substrate and a surface of a second substrate respectively; a second step of bonding the curable resin composition layers provided on each surface of the first and second substrates to each other; and a third step of curing the curable resin composition layer between the first and the second substrates. The present invention enables production of a cured film in which the amount of thermal deformation such as warpage upon heating/cooling is suppressed, and the film can be suitably used as a plastic substrate for a display such as a liquid crystal display device and an organic EL display device, a substrate for a display, such as a substrate for electronic paper and the like, and a substrate for a solar cell.

9 Claims, No Drawings

US 8,460,501 B2

CURED FILM AND METHOD FOR PRODUCTION THEREOF

TECHNICAL FIELD

The present invention relates to a cured film and a method for producing the same. Specifically, the present invention relates to a cured film having a small deformation amount such as warpage upon molding and excellent transparency and a method for producing the same.

BACKGROUND ART

Glass has been widely used as a substrate for a display device such as a liquid crystal display device and an organic EL display device, a substrate for a color filter, a substrate for a solar cell, and the like. In recent years, however, a plastic material is being considered as a substitute for a glass substrate owing to such reasons that the glass substrate is liable to fracture, cannot be bent, is not suitable for reduction in weight due to the large specific gravity thereof, and the like. For example, substrates made of thermoplastic resin such as polyethylene terephthalate, polyethylene naphthalate, polycarbonate, polyolefin and polyethersulfone are proposed (for example, in JP-A-2007-268711, Patent Document 1).

However, these conventional plastic materials for substituting for glass experienced thermal deformation in some cases when it was maintained at a high temperature or subjected to heat treatment. As a method for suppressing thermal deformation, a method of laminating an inorganic fine particle layer on at least one side of a resin film has been proposed (e.g. JP-A-2006-347054; Patent Document 2).

The thermal deformation described in Examples of Patent Document 2 indicates thermal contraction/thermal expansion, which occurs in a temperature range of 100° C. or lower. If the temperature is above the range, it is highly likely that a product is thermally expanded to a greater extent since the temperature reaches the glass transition temperature. Since the heatproof temperature of 200° C. or higher is required for the recent film for a display device substrate, the conventional production method cannot avoid thermal contraction/thermal expansion or deformation such as warpage.

On the other hand, a conventional method for producing a curable resin film is a method of applying a liquid curable resin composition onto a substrate film and, after drying by heating when the composition contains a solvent, curing the composition by heating and/or light irradiation. However, a conventional method as described above makes a slight difference in the contraction degree upon heating between the substrate side and the surface side of the layer of the curable resin composition. Due to the difference, deformation such as warpage occurs upon heating/cooling.

PRIOR ART DOCUMENTS

Patent Documents

Patent Document 1: JP-A-2007-268711
Patent Document 2: JP-A-2006-347054

DISCLOSURE OF THE INVENTION

Problems to be Solved by the Invention

An objective of the present invention is to provide a cured film that has a small amount of thermal deformation such as warpage upon heating/cooling, is excellent in transparency, and can be suitably used as a plastic substrate for a display such as a liquid crystal display device and an organic EL display device, a substrate for a display, such as a substrate for electronic paper and the like, and a substrate for a solar cell; and a production method thereof.

Means to Solve the Problem

The present inventors have found that the above-mentioned problem can be solved by applying a curable resin composition onto two substrates respectively, bonding the curable resin composition layers to each other and curing them and have accomplished the present invention.

That is, the present invention specifically includes the embodiments described in the following [1] to [20].

[1] A method for producing a cured film comprising a first step of applying a curable resin composition onto a surface of a first substrate and a surface of a second substrate respectively to form curable resin composition layers; a second step of bonding the curable resin composition layers provided on each surface of the first and second substrates to each other; and a third step of curing the curable resin composition layer between the first and the second substrates.

[2] The method for producing a cured film as described in [1] above, wherein the curable resin composition contains a volatile solvent and/or a reactive monomer.

[3] The method for producing a cured film as described in [1] above, comprising a step of drying the curable resin composition layer between the first and second steps.

[4] The method for producing a cured film as described in [1] above, comprising a fourth step of releasing the cured layer of the curable resin composition from the first and second substrates after the above third step.

[5] The method for producing a cured film as described in any one of [1] to [4] above, wherein the curable resin composition contains at least one member selected from a group consisting of allyl ester resin, (meth)acrylic resin and vinyl ester resin.

[6] The method for producing a cured film as described in [5] above, wherein the curable resin composition contains curable resin having an aliphatic chain structure and/or an aliphatic ring structure.

[7] The method for producing a cured film as described in any one of [1] to [6] above, wherein the curable resin composition contains a layered inorganic compound.

[8] The method for producing a cured film as described in [7] above, wherein the layered inorganic compound is a synthetic smectite.

[9] The method for producing a cured film as described in [8] above, wherein the synthetic smectite has between its layers at least one cation selected from lauryltrimethylammonium cation, stearyltrimethylammonium cation, trioctylmethylammonium cation, distearyldimethylammonium cation, di-hydrogenated beef tallow dimethylammonium cation, distearyldibenzylammonium cation and N-polyoxyethylene-N-lauryl-N,N-dimethylammonium cation.

[10] The method for producing a cured film as described in [8] or [9] above, wherein the terminal hydroxy groups of the synthetic smectite are treated by a surface modification agent.

[11] The method for producing a cured film as described in [10] above, wherein the surface modification agent is selected from a silane coupling agent, a titanate coupling agent, a glycidyl compound, an isocyanate compound, a carboxylic acid and an alcohol.

[12] The method for producing a cured film as described in [1] above, wherein the curing is conducted by at least one of an electron beam (EB) irradiation, an ultraviolet ray (UV) irradiation, an infrared ray (IR) irradiation and heating.

[13] The method for producing a cured film as described in [12] above, wherein the curable resin composition layer between the first and second substrates is cured by being irradiated by electron beam (EB), ultraviolet ray (UV) or infrared ray (IR) with almost the same exposure from the side of the first substrate and that of the second substrate.
[14] The method for producing a cured film as described in [12] above, wherein the curing by heating is conducted by applying almost the same amount of heat to the curable resin composition layer between the first and second substrates from the side of the first substrate and that of the second substrate.
[15] A cured film produced by a production method described in any one of [1] to [14] above.
[16] The cured film as described in [15] above having an average linear coefficient of thermal expansion of 30 ppm/° C. or less in a planar direction at from 50 to 250° C. and a total light transmittance of 85% or more per 100 μm in thickness.
[17] A transparent conductive film comprising a transparent conductive layer on the cured film according to [15] or [16] above.
[18] A display device comprising a cured film according to [15] or [16] above as a substrate.
[19] A display device according to [18] above, wherein the display device is a liquid crystal display, an organic EL display or an electronic paper.
[20] A substrate for a solar cell comprising the cured film according to [15] or [16] above as a substrate.

Effects of the Invention

The conventional plastic film has a problem of a large deformation amount upon heating/cooling. The method for producing a curable resin film of the present invention enables providing a film having a small thermal deformation amount, which film is suitable for use in a a flexible display substrate and a substrate for a solar cell.

EMBODIMENT TO CARRY OUT THE INVENTION

The cured film of the present invention means a film obtained by curing a curable resin composition containing curable resin, which curable resin composition may further contain a reactive monomer, layered inorganic compound, curing agent, additive and solvent.
The method for producing a cured film of the present invention comprises a first step of applying a curable resin composition onto a surface of a first substrate and a surface of a second substrate respectively; a second step of bonding and adhering the curable resin composition layers provided on each surface of the first and second substrates to each other; and a third step of curing the curable resin composition layer between the first and the second substrates.
In the invention, the transparency of the cured film is evaluated in terms of total light transmittance. The film of the invention has a total light transmittance of 85% or more per 100 μm in thickness, and a haze value of 5% or less. The total light transmittance is more preferably 90% or more. The cured film preferably has a haze value of 3% or less. In the case where the haze value exceeds 5%, transmitted light is distorted to lose vividness. The total light transmittance is measured according to JIS K7361-1, and the haze value is measured according to JIS K7136.
The film of the invention is not limited in shape, and film or a molded article in a shape of a film is particularly preferred. An article having a thickness of from 10 to 200 μm is referred to as a film, an article having a thickness of larger than 200 μm and 5,000 μm or less is referred to as a sheet, and an article having a thickness larger than 5,000 μm is referred to as a plate, but hereinafter, the articles are referred to as films irrespective of the thickness of a film.
[Curable Resin Composition]
The curable resin composition of the present invention means a curable resin alone and/or a mixture mainly comprising a curable resin. Each component of the curable resin composition is to be described below.
[Curable Resin]
In the present invention, a curable resin means a resin represented by epoxy resin which is cured by heating or by light irradiation. Examples of the curable resin include allyl ester resin, (meth)acrylic resin, epoxy resin, phenol resin, vinyl ester resin and unsaturated polyester resin. The curable resin may be either solid or liquid. When the curable resin is solid, it may be melted to be applied, but it is desirable that the resin can turn to liquid by being dissolved with a solvent and a reactive monomer to be applied onto a substrate.
Among curable resins, particularly preferred are allyl ester resin, vinyl ester resin and (meth)acrylic resin which have high transparency and less coloring.
[Allyl Ester Resin]
The allyl ester resin composition of the present invention contains a compound having allyl group or methallyl group (hereinafter, both sometimes referred to as "(meth)allyl group") and an ester structure.
The compound having (meth)allyl group and an etser structure can be obtained through (1) esterification reaction between a compound having (meth)allyl group and hydroxy group (here, collectively referred to as "allyl alcohol") and a compound having carboxyl group, (2) esterification reaction between a compound having (meth)allyl group and carboxyl group and a compound having hydroxyl group, or (3) ester exchange reaction between an ester compound obtained from allyl alcohol and dicarboxylic acid and a polyvalent alcohol.
In a case where the compound having a carboxyl compound in (1) and (2) above is an ester oligomer of dicarboxylic acid and a diol, the compound may have allyl alcohol ester only at terminus. Examples of an ester compound obtained from allyl alcohol and dicarboxylic acid in (3) include at least one kind of compound selected from the compounds represented by formula (1).

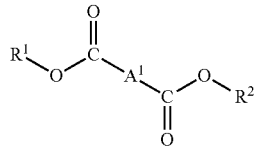

In the formula, $R^1$ and $R^2$ independently represent either of allyl group or methallyl group, $A^1$ represents an organic residue which is derived from dicarboxylic acid and has at least one structure from an alicyclic structure, aromatic ring structure and aliphatic chain structure. The compound may be contained in the allyl ester resin composition of the present invention as a reactive diluent (reactive monomer) as well as may become a raw material of allyl ester oligomer described later. $A^1$ in formula (1) is preferably the same with $A^2$ and $A^3$ in formulae (2) and (3) described later.
It is preferred that the compound having (meth)allyl group and an ester structure be an allyl ester compound having an ester structure formed from polyvalent alcohol and dicarboxylic acid, having allyl group and/or methallyl group as terminus (hereinafter, the compound is sometimes referred to as "allyl ester oligomer").

Further, the resin may contain as other components curing agent, reactive monomer, additives and other radically reactive resin components described later.

It is preferred that the allyl ester oligomer of the present invention be a compound having a group represented by formula (2) as terminus, and having a structure represented by formula (3) as constituent unit.

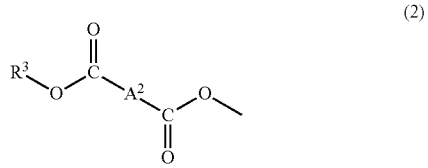

(2)

In the formula, $R^3$ represents allyl group or methallyl group, $A^2$ represents an organic residue which is derived from dicarboxylic acid and has at least one structure from an alicyclic structure, aromatic ring structure and aliphatic chain structure.

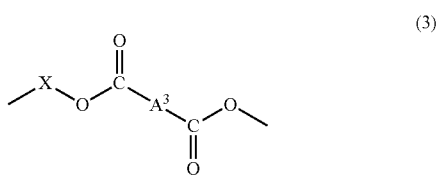

(3)

In the formula, $A^3$ represents an organic residue which is derived from dicarboxylic acid and has at least one structure from an alicyclic structure, aromatic ring structure and aliphatic chain structure, X represents an organic residue derived from polyvalent alcohol, with a proviso that X may have a branched structure through ester bonds, having a group represented by formula (2) as terminus and a group represented by formula (3) as constituent unit.

In the allyl ester oligomer of the present invention, there are at least two terminuses represented by formula (2), but in a case where X in formula (3) has a branched structure, there are three or more terminuses. In this case, there exist multiple $R^3$'s for each of the terminuses. These $R^3$'s need not be of the same kind and the structure of one terminus may include allyl group while that of another terminus may include methallyl group. Moreover, all the $R^3$'s do not necessarily have to be allyl group or methallyl group. To an extent that does not impair curability, some of the $R^3$'s may be a non-polymerizable group such as methyl group and ethyl group.

Similarly, with respect to the structure represented by $A^2$, the terminuses may be different from each other. For example, the structure of $A^2$ at one terminus may include a benzene ring while $A^2$ at another terminus may include a cyclohexane ring. $A^2$ in formula (2) is an organic residue which is derived from dicarboxylic acid and has at least one structure from an alicyclic structure, aromatic ring structure and aliphatic chain structure. The portion derived from dicarboxylic acid is shown as a carbonyl structure adjacent to $A^2$. Therefore, $A^2$ shows a benzene skeleton or a cyclohexane skeleton. In the interest of transparency, dicarboxylic acid having an alicyclyc structure or an aliphatic chain structure is preferable to carboxylic acid having an aromatic ring structure.

Although there is no particular limitation on dicarboxylic acid from which $A^2$ is derived from, terephthalic acid, isophthalic acid, phthalic acid, 1,4-cyclohexane dicarboxylic acid, 1,4-naphthalene dicarboxylic acid, 1,5-naphthalene dicarboxylic acid, 2,7-naphthalene dicarboxylic acid, diphenyl-m, m'-dicarboxylic acid, diphenyl-p,p'-dicarboxylic acid, benzophenone-4,4'-dicarboxylic acid, p-phenylene diacetate, p-carboxyphenyl acetate, methylterephthalic acid, tetrachlorophthalic acid, malonic acid, succinic acid, glutaric acid, adipic acid, 2-methylsuccinic acid, maleic acid, fumaric acid, itaconic acid, citraconic acid and endic anhydride. Among these dicarboxylic acids, preferred is dicarboxylic acid having an aliphatic chain structure or an alicyclic structure including malonic acid, succinic acid, glutaric acid, adipic acid, 2-methylsuccinic acid and 1,4-cyclohexanedicarboxylic acid. Dicarboxylic acid having an alicyclic structure is more preferable and examples thereof include 1,4-cyclohexanedicarboxylic acid.

As dicarboxylic acid from which $A^2$ is derived from, when the one having an alicyclic structure such as 1,4-cyclohexanedicarboxylic is used, a flexible molded product can be obtained which can be easily made into a transparent film and the like. Also, by using dicarboxylic acid having an alicyclic structure which enables good dispersion of a tabular inorganic substance in resin, a film having excellent transparency and less coloring can be obtained.

At least one constituent unit represented by above-described formula (3) is required in allyl ester oligomer. It is preferred that the molecular weight of the whole allyl ester oligomer be increased to a certain level by repetition of this unit, so that appropriate viscosity may be obtained, enhancing workability and toughness of cured product. However, if the molecular weight is too high, the molecular weight between the cross-link points becomes too high, which results in lowering the glass transition temperature (Tg) and may deteriorate the heat resistance. Therefore, it is important to adjust the molecular weight appropriately for purposes.

The allyl ester resin composition used in the present invention contains a laminated inorganic compound having a number average particle diameter of from 10 to 300 nm and an aspect ratio of from 10 to 300. By containing the laminated inorganic compound, the resin composition enables improving the glass transition (Tg) temperature and the linear expansion coefficient while maintaining the transparency. However, the cured product tends to be fragile when the allyl ester oligomer has a low molecular weight. Accordingly, it is preferable to adjust the molecular weight of the allyl ester oligomer slightly high in the allyl ester resin composition of the present invention. The weight average molecular weight is preferably 500 to 100,000, more preferably 1,000 to 50,000.

The skeleton of the oligomer can be selected with no particular limitations. When a linear oligomer having a high molecular weight is used, the obtained resin tends to be relatively flexible and have high toughness. When a branched oligomer is selected, it is possible to obtain a resin having high hardness and high heat resistance. It is also possible to control the flexibility and hardness appropriately by mixing both of the oligomers.

$A^3$ in formula (3) is an organic residue which is derived from dicarboxylic acid and has at least one structure from an alicyclic structure, aromatic ring structure and aliphatic chain structure, and its definition and preferred examples of the compound are the same as in $A^2$ in formula (2). X in formula (3) represents an organic residue derived from polyvalent alcohol. Polyvalent alcohol is a compound having two or more hydroxyl groups, and preferably two hydroxyl groups, and X itself represents the skeleton portion except for hydroxyl groups. Further, in the polyvalent alcohol, since at least two hydroxyl groups have to be bonded, some hydroxyl groups may remain unreacted when the polyvalent alcohol has a valence of three or more. i.e. it has three or more hydroxyl groups.

Examples of polyvalent alcohol include ethylene glycol, propylene glycol, 1,3-propane diol, 1,4-butane diol, 1,3-butane diol, 1,5-pentane diol, neopentyl glycol, 1,6-hexane diol, 1,4-cyclohexane dimethanol, diethylene glycol, ethylene oxide adduct of isocyanuric acid, pentaerythritol, tricyclodecanedimethanol, glycerine, trimethylol propane, ethylene oxide adduct of pentaerithritol, D-sorbitol and hydrogenated bisphenol-A.

With respect to the constituent unit represented by formula (3) in the allyl ester oligomer, one type of the constituent unit may be repeated or different types of the unit may be included. That is, the allyl ester oligomer may be a copolymer type. In this case, in one allyl ester oligomer, several kinds of X exist. For example, the structure may include a residue derived from propylene glycol as one X and another residue derived from trimethylol propane as another X. In this case, allyl ester oligomer has branches at trimethylol propane residue. Two or more types of $A^3$ may exist as well. A structural formula (4), an example in a case where $R^3$ is allyl group, $A^2$ and $A^3$ are residues derived from isophthalic acid, X is propylene glycol or trimethylol propane, is shown below.

Though the vinyl ester resin is not particularly limited, when a layered inorganic compound is used, it is preferably a vinyl ester resin synthesized from an aliphatic epoxy compound, and more preferably, a vinyl ester resin synthesized from an epoxy compound having an alicyclic structure. Examples of the alicyclic epoxy compound include a hydrogenated bisphenol A epoxy resin, a cyclohexane type compound such as diglycidyl 1,2-cyclohexanedicarboxylate, 3,4-epoxycyclohexenylmethyl-3',4'-epoxycyclohexene carboxylate and bis(3,4-epoxy-6-methylcyclohexylmethyl) adipate; a norbornene type compound such as 3-oxatricyclo[3.2.1.02,4]octane-6-carboxylic acid and 3-oxatricyclo[3.2.1.02,4]oct-6-yl methyl ester; an adamantane type compound such as 7-oxabicyclo[4.1.0]heptane-3-carboxylic acid and tricyclo[3.3.1.13,7]decan-1,3-diyl ester. Among these, a hydrogenated bisphenol A epoxy resin is more preferred from the standpoint of transparency, toughness and heat resistance. A resin having a molecular weight of 800 or more can further improve the toughness. Even in the case where an epoxy resin as a raw material has an average molecular weight of less than 500, the molecular weight may be increased by using partly such dicarboxylic acids such as succinic acid, adipic acid, dodecanedicarboxylic acid and 1,4-cyclohexanedicarboxylic acid.

Upon producing the vinyl ester resin, the reaction is performed by charging the above-mentioned epoxy compound (4)

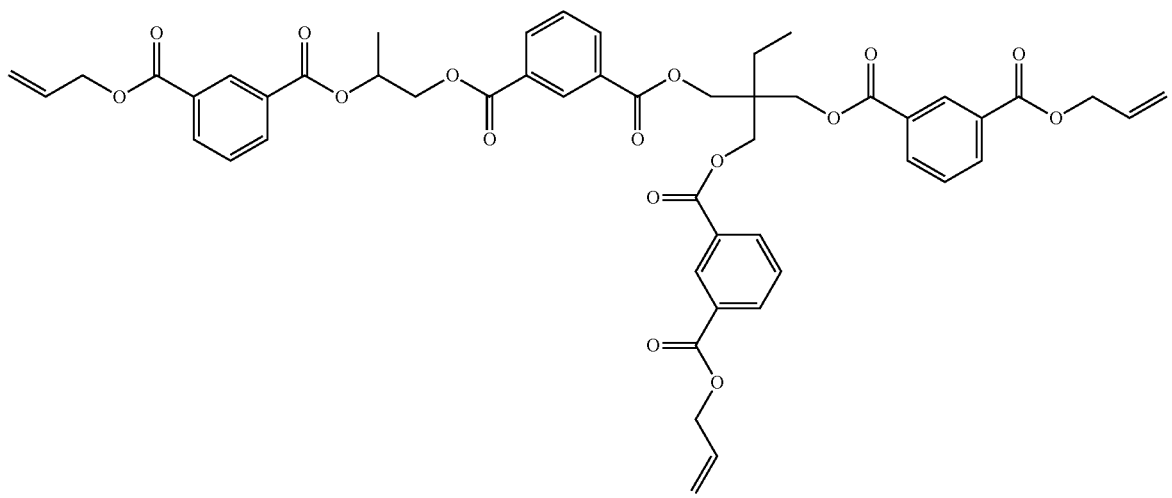

[Vinyl Ester Resin]

The vinyl ester resin in the present invention invention is also referred to as epoxy(meth)acrylate, and generally means (1) a resin having an ethylenic unsaturated group, synthesized by ring-opening reaction of an epoxy compound, represented by an epoxy resin, and a carboxyl group of a carboxyl compound having a radical polymerizable carbon-carbon double bond (ethylenic unsaturated group) such as (meth)acrylic acid, or (2) a resin having a polymerizable unsaturated group, synthesized by ring-opening reaction of a compound having a carboxyl group and an epoxy group of a polymerizable unsaturated compound having an epoxy group in the molecule thereof, such as glycidyl(meth)acrylate. Details thereof are disclosed in "Polyester Jushi Handbook" (Polyester Resin Handbook), published by Nikkan Kogyo Shimbun, Ltd., 1988, pp. 336-357, and the like. The vinyl ester resin can be produced by a known method.

and the ethylenic unsaturated compound having a carboxyl group in a reactor, into which air is blown. The reaction temperature is preferably from 70 to 150° C., and more preferably from 80 to 140° C. In the case where the reaction temperature is less than 70° C., it is not economical since the reaction time is prolonged. In the case where the reaction temperature exceeds 150° C., the system is gelled in many cases.

A reaction catalyst may not be added, but it is economical when the catalyst is added since the reaction time is shortened. Preferred examples of the catalyst include a tertiary amine compound, a phosphine compound and an onium salt. Specific examples of the tertiary amine compound include dimethylcyclohexylamine, N,N-dimethylpiperazine and benzyldimethylamine; and examples of the phosphine compound include triphenylphosphine, tritolylphosphine and tricyclohexylphosphine. Examples of the onium salt include a quaternary ammonium salt and a quaternary phosphonium salt; examples of the quaternary ammonium salt include tetramethylammonium chloride, tetrabutylammonium chloride, tetramethylammonium bromide, tetrabutylammonium bromide and decyltrimethylammonium chloride; and examples of the quaternary phosphonium salt include tetraphenylphosphonium chloride, benzyltriphenylphosphonium chloride, tetraphenylphosphonium bromide and tetramethylphosphonium tetraphenylborate. The addition amount of the catalyst is preferably from 0.05 to 3 parts by mass, and more preferably from 0.1 to 2 parts by mass, per 100 parts by mass in total of the epoxy resin and the ethylenic unsaturated compound having a carboxyl group. An amount of the catalyst less than 0.05 part by mass is not preferred since no effect of accelerating the reaction is exhibited, and an amount of the catalyst exceeding 3 parts by mass is not preferred since the resin is significantly colored.

[(Meth)acrylate Resin]

The (meth)acrylate resin in the present invention is preferably curable polyfunctional (meth)acrylate. Examples of the polyfunctional (meth)acrylate include di(meth)acrylate compound such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, 1,3-butylene glycol di(meth)acrylate, 1,4-butanediol di(meth)acrylate, 1,5-pentanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, dimethyloltricyclodecane di(meth)acrylate, polybutadiene di(meth)acrylate, 2,2-bis(4-(meth)acryloyloxyphenyl)propane, 2,2-bis(4-($\omega$-(meth)acryloyloxypolyethoxy)phenyl)propane, and di(meth)acrylate of an ethylene oxide adduct of bisphenol A; a trifunctional crosslinking monomer such as trimethylolethane tri(meth)acrylate, trimethylolpropane tri(meth)acrylate, triacrylate of an ethylene oxide adduct of trimethylolpropane and pentaerythritol tri(meth)acrylate; and a tetrafunctional or higher polyfunctional acrylate such as pentaerythritol tetra(meth)acrylate, tetra(meth)acrylate of an ethylene oxide adduct of pentaerythritol and dipentaerythritol hexa(meth)acrylate. In addition, urethane(meth)acrylate having an urethane bond in the interior skeleton and (meth)acrylate of polyester polyol having an ester bond in the interior skeleton may be used.

[Reactive Monomer]

In the curable resin composition of the invention, a reactive monomer (which is also referred to as "reactive diluent") may be added for such purposes as control of the curing rate, adjustment of the viscosity (improvement of workability), enhancement of the crosslinking density and addition of functionalities. The reactive monomer is not particularly limited, and various kinds thereof may be used, and a monomer having a radical polymerizable carbon-carbon double bond (ethylenic unsaturated group) such as a vinyl group and an allyl group is preferred for reacting with the curable resin composition. Examples of the monomer include a monofunctional monomer having one ethylenic unsaturated group in one molecule and a polyfunctional monomer having two or more ethylenic unsaturated groups in one molecule. Preferred specific examples of the reactive monomer are described below. The term (meth)acrylate indicates acrylate and methacrylate.

Examples of the monofunctional monomer include an aliphatic (meth)acrylate, such as methyl(meth)acrylate, ethyl (meth)acrylate, n-butyl(meth)acrylate, sec-butyl(meth)acrylate, t-butyl(meth)acrylate, 2-ethylhexyl(meth)acrylate, octyl (meth)acrylate, dodecyl(meth)acrylate, octadecyl(meth) acrylate, isobornyl(meth)acrylate, cyclohexyl(meth)acrylate, methylcyclohexyl(meth)acrylate, 4-t-butylcyclohexyl(meth) acrylate, dicyclopentenyl(meth)acrylate, dicyclopentanyl (meth)acrylate, dicyclopentenyloxymethyl(meth)acrylate, dicyclopentenyloxyethyl(meth)acrylate, ethoxyethyl(meth) acrylate, ethoxydiethylene glycol(meth)acrylate, 2-hydroxyethyl(meth)acrylate and 2-hydroxypropyl(meth)acrylate; an aromatic (meth)acrylate, such as benzyl(meth)acrylate, phenyl(meth)acrylate, phenoxyethyl(meth)acrylate, phenoxydiethylene glycol(meth)acrylate, 1-naphthyl(meth)acrylate, fluorophenyl(meth)acrylate, chlorophenyl(meth)acrylate, cyanophenyl(meth)acrylate, methoxyphenyl(meth)acrylate and biphenyl(meth)acrylate; a haloalkyl(meth)acrylate such as fluoromethyl(meth)acrylate and chloromethyl(meth)acrylate; a (meth)acrylate compound such as glycidyl(meth)acrylate, alkylamino(meth)acrylate and cyanoacrylate ester; a nitrogen-containing monomer such as acrylamide, N,N-dimethylacrylamide, N,N-diethylacrylamide, N-vinylformamide, N-vinylacetamide, N-vinyl-$\epsilon$-caprolactam, N-vinylpyrrolidone, 1-vinylimidazole, N-vinylcarbazole, N-vinylmorpholine, N-vinylpyridine and acryloylmorpholine; styrene, $\alpha$-methylstyrene, chlorostyrene, styrenesulfonic acid, 4-hydroxystyrene, vinyltoluene, vinyl acetate, vinyl propionate, vinyl benzoate and the like.

Examples of the polyfunctional monomer include a di(meth)acrylate compound such as ethylene glycol di(meth) acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, 1,3-butylene glycol di(meth)acrylate, 1,4-butanediol di(meth)acrylate, 1,5-pentanediol di(meth)acrylate, 1,6-hexanediol di(meth)acrylate, neopentyl glycol di(meth)acrylate, 1,9-nonanediol di(meth) acrylate, 1,10-decanediol di(meth)acrylate, dimethyloltricyclodecane di(meth)acrylate, polybutadiene di(meth)acrylate, 2,2-bis(4-(meth)acryloyloxyphenyl)propane, 2,2-bis(4-($\omega$-(meth)acryloyloxypolyethoxy)phenyl)propane, and di(meth) acrylate of an ethylene oxide adduct of bisphenol A; a trifunctional crosslinking monomer such as trimethylolethane tri (meth)acrylate, trimethylolpropane tri(meth)acrylate, triacrylate of an ethylene oxide adduct of trimethylolpropane and pentaerythritol tri(meth)acrylate; a tetrafunctional or higher polyfunctional acrylate such as pentaerythritol tetra (meth)acrylate, tetra(meth)acrylate of an ethylene oxide adduct of pentaerythritol and dipentaerythritol hexa(meth) acrylate; an aromatic diallyl carboxylate compound such as diallyl phthalate, diallyl isophthalate, dimethallyl isophthalate, diallyl terephthalate, triallyl trimellitate, diallyl 2,6-naphthalenedicarboxylate, diallyl 1,5-naphthalanedicarboxylate, allyl 1,4-xylenedicarboxylate and diallyl 4,4'-diphenyldicarboxylate; and an allyl compound such as diallyl cyclohexanedicarboxylate, tri(meth)allyl isocyanurate, tri (meth)allyl cyanurate and diallyl chlorendate.

The reactive monomers may be used solely or in combination of two or more of them. The amount of the reactive monomer used is not particularly limited, and from 0 to 70% by mass of the reactive monomer is preferably used with from 30 to 100% by mass of the curable resin. An amount of the reactive monomer used exceeding 70% by mass is not preferred since the excellent transparency of the curable resin may not be exhibited, and the mechanical strength inherent to the curable resin may be decreased.

[Laminated Inorganic Compound]

The laminated inorganic compound used in the invention is not particularly limited as far as it has a number average particle diameter of from 10 to 300 nm and an aspect ratio of from 10 to 300. The preferable laminated inorganic compound is synthetic smectite in view of less coloring.

In the case where the cured film of the invention is used as a substrate for a display, it is necessary that the average particle diameter is sufficiently smaller than the wavelength of visible light. The visible light referred herein means light having a wavelength in a range of from 400 to 800 nm. Accordingly, the number average particle diameter of the synthetic smectite is preferably in a range of from 10 to 300 nm, and more preferably in a range of from 30 to 200 nm. In the case where the number average particle diameter is less than 10 nm, there is a tendency that the coefficient of thermal expansion in the plane direction of the transparent film is not sufficiently small, and in the case where it exceeds 300 nm, particles having a particle diameter overlapping the visible light wavelength are contained, and thus it is not preferred from the standpoint of transparency. The number average particle diameter of the synthetic smectite referred herein means a number average particle diameter obtained by measuring the particles dispersed in a solvent by a dynamic light scattering method. The number average particle diameter by a dynamic light scattering method can be obtained, for example, by referring to "Ryushi-kei Keisoku Gijutsu" (Particle Diameter Measuring Techniques), edited by The Society of Powder Technology, Japan, 1994, pp. 169-179. Specific examples of the measuring equipment include a dynamic light scattering particle diameter distribution measuring equipment (for example, Model LB-550, produced by Horiba, Ltd.). It can be considered that the number average particle diameter of the synthetic smectite obtained by the dynamic light scattering method is substantially the same as the number average particle diameter of the synthetic smectite after dispersing in the resin in the invention.

The aspect ratio (Z) of the synthetic smectite is expressed by the relationship, $Z=L/a$. L represents the number average particle diameter in a solvent, which L is obtained by the dynamic light scattering method, and a represents the unit thickness of the synthetic smectite. The unit thickness a can be calculated by measuring diffraction peaks of a laminated inorganic substance by a powder X-ray diffractometry. The synthetic smectite of the invention has an aspect ratio in a range of from 10 to 300, and more preferably in a range of from 30 to 100. The aspect ratio is preferably 10 or more from the standpoint that it is liable to be oriented in the plane direction of the transparent film. In the case where the synthetic smectite has an aspect ratio of less than 10, the coefficient of thermal expansion may not be in a prescribed range (preferably 30 ppm/° C. or less). In the case where synthetic smectite having an aspect ratio exceeding 300 is used, the total light transmittance of the transparent film may be decreased.

The synthetic smectite may be synthesized by a known method (for example, Haruo Shirozu, "Nendokobutsu-gaku, Nendo Kagaku no Kiso" (Clay Mineralogy, Basis of Clay Science), published by Asakura Publishing Co., Ltd., 1988, pp. 98-100), and commercially available synthetic smectite may be used. Examples of the synthetic smectite that are preferably used include synthetic hectorite, synthetic saponite and synthetic stevensite, and examples of the commercially available product include Synthetic Smectite SWN (synthetic hectorite), produced by Co-op Chemical Co., Ltd., Synthetic Inorganic Polymer Smecton SA (synthetic saponite), produced by Kunimine Industries Co., Ltd., Synthetic Silicate Laponite (synthetic hectorite), produced by Rockwood Specialties, Inc., and Synthetic Silicate Magnedium Salt Ionite (synthetic stevensite), produced by Mizusawa Industrial Chemicals, Ltd. More preferred examples among these include Synthetic Smectite SWN, produced by Co-op Chemical Co., Ltd. from the standpoint of transparency, cation exchange capacity and size.

In the present invention, the synthetic smectite is used which has been subjected to organizing treatment with a quaternary ammonium salt and/or a quaternary phosphonium salt, thereby having enhanced dispersibility in the resin. Examples of the method for organizing treatment include a method of exchanging exchangeable metallic cations such as sodium and calcium present among the flake-like crystalline layers of the synthetic smectite with various kinds of substances having cationic property such as a cationic surfactant, to insert the substances among the crystalline layers of the synthetic smectite (intercalation).

Examples of the cation inserted between the layers of the synthetic smectite include lauryltrimethylammonium cation, stearyltrimethylammonium cation, trioctylmethylammonium cation, distearyldimethylammonium cation, di-hydrogenated beef tallow dimethylammonium cation, distearyldibenzylammonium cation and N-polyoxyethylene-N-lauryl-N,N-dimethylammonium cation.

The cation exchange capacity of the synthetic smectite in this case is not particularly limited, and is preferably from 50 to 1,200 milliequivalent per 100 g. In the case where the cation exchange capacity is less than 50 milliequivalent per 100 g, the amount of the cationic substance intercalated among the crystalline layers of the synthetic smectite is small, and there are cases where the crystalline layers are not sufficiently made to be non-polar (hydrophobic). In the case where the cation exchange capacity exceeds 1,200 milliequivalent per 100 g, the bonding strength among the crystalline layers of the synthetic smectite becomes too large, whereby the crystalline flakes may be difficult to be released.

The organizing method is also referred to as a cation exchanging method with a cationic surfactant, and is effective for the case where the resin component of the film of the invention has low polarity, whereby the affinity between the synthetic smectite and the low polar resin can be improved, and the synthetic smectite can be finely dispersed in the low polar resin more uniformly.

The cationic surfactant used herein is not particularly limited, and an alkylammonium ion salt having 6 or more carbon atoms, an aromatic quaternary ammonium ion salt and a heterocyclic quaternary ammonium ion salt are preferably used since the crystalline layers of the synthetic smectite can be sufficiently made to be hydrophobic.

The quaternary ammonium salt is not particularly limited, and examples thereof include a trimethylalkylammonium salt, a triethylalkylammonium salt, a tributylalkylammonium salt, a dimethydialkylammonium salt, a dibutyldialkylammonium salt, a methylbenzyldialkylammonium salt, a dibenzyldialkylammonium salt, a trialkylmethylammonium salt, a trialkylethylammonium salt, a trialkylbutylammonium salt; a quaternary ammonium salt having an aromatic ring, such as benzylmethyl{2-[2-(p-1,1,3,3-tetramethylbutylphenoxy)ethoxy]ethyl}ammonium chloride and the like; a quaternary ammonium salt derived from an aromatic amine, such as trimethylphenylammonium and the like; a quaternary ammonium salt having a heterocyclic ring, such as an alkylpyridinium salt, imidazolium salt and the like; a dialkyl quaternary ammonium salt having two polyethylene glycol chains, a dialkyl quaternary ammonium salt having two polypropylene glycol chains, a trialkyl quaternary ammonium salt having one polyethylene glycol chain, a trialkyl quaternary ammonium salt having one polypropylene glycol chain and the like. Among these, lauryltrimethylammonium salt, stearyltrimethylammonium salt, trioctylmethylammonium salt, distearyldimethylammonium salt, di-hydrogenated beef tallow dimethylammonium salt, distearyldibenzylammonium salt, N-polyoxyethylene-N-lauryl-N,N-dimethylammonium salt and the like are preferred. These organic quaternary ammonium salts may be used solely or in combination of two or more of them. Examples of the commercially available product include lipophilic synthetic smectite SPN, STN and SAN (which are made by hydrophobizing SWN with quaternary ammonium salt), produced by Co-op Chemical Co., Ltd.

The organic quaternary phosphonium salt is not particularly limited, and examples thereof include dodecyltriphenylphosphonium salt, methyltriphenylphosphonium salt, lauryltrimethylphosphonium salt, stearyltrimethylphosphonium salt, trioctylmethylphosphonium salt, distearyldimethylphosphonium salt and distearyldibenzylphosphonium salt. These organic quaternary phosphonium salts may be used solely or in combination of two or more of them.

Upon enhancing the dispersibility of the synthetic smectite by using the organic quaternary ammonium salt and/or organic quaternary phosphonium salt with the curable resin composition, aliphatic quaternary ammonium salt and/or quaternary phosphonium salt are preferably used, and a trialkylmethylammonium salt and a trialkyl quaternary ammonium salt having one polypropylene glycol chain are particularly preferred.

Furthermore, a surface modification agent may be used for dispersing the synthetic smectite highly in the curable resin composition.

The synthetic smectite used in the invention may be subjected to the organizing treatment not only among the layers but also on the surface thereof. The surface of the synthetic smectite has a functional group such as a hydroxyl group, and therefore, can be organized with a compound having a functional group having reactivity with the terminal hydroxyl group. The compound having a functional group capable of being chemically bonded to the hydroxyl group (surface modification agent) is not particularly limited, and examples thereof include compounds having the functional group such as a silane compound (silane coupling agent), a titanate compound (titanate coupling agent), a glycidyl compound, an isocyanate compound, carboxylic acids and alcohols. These compounds may be used solely or in combination of two or more of them.

Among the compounds, a silane compound is preferably used. Specific examples of the silane compound include vinyltrimethoxysilane, vinyltriethoxysilane, γ-aminopropyltrimethoxysilane, γ-aminopropylmethyldimethoxysilane, γ-aminopropyldimethylmethoxysilane, γ-aminopropyltriethoxysilane, γ-aminopropylmethyldiethoxysilane, γ-aminopropyldimethylethoxysilane, methyltriethoxysilane, dimethyldimethoxysilane, trimethylmethoxysilane, hexyltrimethoxysilane, hexyltriethoxysilane, octadecyltrimethoxysilane, octadecyltriethoxysilane, γ-methacryloxypropylmethyldimethoxysilane, γ-methacryloxypropylmethyldiethoxysilane, γ-methacryloxypropyltrimethoxysilane and γ-methacryloxypropyltriethoxysilane. These silane compounds may be used solely or in combination of two or more of them.

The content of the synthetic smectite in the film is preferably in a range of from 10 to 40% by mass, and more preferably in a range of from 15 to 30% by mass. In the case where the content of the synthetic smectite is less than 10% by mass, the average coefficient of thermal expansion of the transparent composite material at from 50 to 250° C. becomes larger than 30 ppm/° C. In the case where the content of the synthetic smectite exceeds 40% by mass, it becomes difficult to disperse the synthetic smectite uniformly in the resin, and the mechanical strength of the transparent composite material is decreased to be brittle and fragile.

[Curing Agent]

Upon curing the curable resin composition of the invention, curing by ultraviolet ray (UV) irradiation is preferably employed, and the composition also may be cured by electron beam (EB) irradiation, infrared ray (IR) irradiation or heating. In the case where the composition is cured by UV/IR irradiation or heating, a curing agent may be used. The curing agent that can be used is not particularly limited, and those that are ordinarily used as a curing agent for a polymerizable resin may be used. Among these, a radical polymerization initiator is preferably added from the standpoint of polymerization initiation of a (meth)acryloyloxy group. Examples of the radical polymerization initiator include a photopolymerization initiator, an organic peroxide and an azo compound. For UV-curing the vinyl ester resin composition of the invention, a photopolymerization initiator is particularly preferred.

Examples of the photopolymerization initiator include 2,2-dimethoxy-1,2-diphenylethan-1-one, 1-hydroxycyclohexyl phenyl ketone, benzophenone, 2-methyl-1-(4-methylthiophenyl)-2-morpholinopropan-1-one, 2-benzyl-2-dimethylamino-1-(4-morpholinophenyl)butanone-1,2-hydoxy-2-methyl-1-phenylpropan-1-one, 1-[4-(2-hydroxyethoxy)phenyl]-2-hydroxy-2-one, 2-hydroxy-1-{4-[4-(2-hydroxy-2-methylpropyonyl)benzyl]-phenyl}-2-methylpropan-1-one, oxyphenylacetic acid 2-[2-oxo-2-phenylacetoxyethoxy]ethyl ester, oxyphenylacetic acid 2-[2-hydroxyethoxy]ethyl ester, phenylglyoxylic acid methyl ester, 2-dimethylamino-2-(4-methylbenzyl)-1-(4-morpholin-4-ylphenyl)butan-1-one, bis(2,4,6-trimethylbenzoyl)phenylphosphine oxide, 1,2-octadione, 1-[4-(phenylthio)phenyl-2-(O-benzoyloxime)], ethanone, 1-[9-ethyl-6-(2-methylbenzoyl)-9H-carbazol-3-yl]-1-(O-acetyloxime), iodonium (4-methylphenyl)[4-(2-methylpropyl)phenyl]hexafluorophosphate(1-), ethyl-4-dimethylaminobenzoate, 2-ethylhexyl-4-dimethylaminobenzoate and 2,4,6-trimethylbenzoyldiphenylphosphine oxide.

As the organic peroxide, known ones may be used, such as a dialkyl peroxide, an acyl peroxide, a hydroperoxide, a ketone peroxide and a peroxyester. Specific examples thereof include diisobutyryl peroxide, cumyl peroxyneodecanoate, di-n-propyl peroxydicarbonate, diisopropyl peroxydicarbonate, di-sec-butyl peroxydicarbonate, 1,1,3,3-tetramethylbutyl peroxyneodecanoate, di(4-t-butylcyclohexyl)peroxydicarbonate, di(2-ethylhexyl)peroxidicarbonate, t-hexyl peroxyneodecanoate, t-butyl peroxyneodecanoate, t-butyl peroxyneoheptanoate, t-hexyl peroxypivalate, t-butyl peroxypivalate, di(3,5,5-trimethylhexanoyl)peroxide, dilauroyl peroxide, 1,1,3,3-tetramethylbutyl peroxy-2-ethylhexanoate, disuccinic acid peroxide, 2,5-dimethyl-2,5-di(2-ethylhexanoylperoxy)hexane, t-hexyl peroxy-2-ethylhexanoate, di(4-methylbenzoyl)peroxide, t-butyl peroxy-2-ethylhexanoate, di(3-methylbenzoyl)peroxide, benzoyl(3-methylbenzoyl)peroxide, dibenzoyl peroxide, 1,1-di(t-butylperoxy)-2-methylcyclohexane, 1,1-di(t-hexylperoxy)-3,3,5-trimethylcyclohexane, 1,1-di(t-butylperoxy)cyclohexane, 2,2-bis[4,4-di(t-butylperoxy)cyclohexyl]propane, t-hexylperoxyisopropyl monocarbonate, t-butylperoxymaleic acid, t-butyl peroxy-3,5,5-trimethylhexanoate, t-butyl peroxylaurate, t-butylperoxyisopropyl monocarbonate, t-butylperoxy-2-ethylhexyl monocarbonate, t-hexyl peroxybenzoate, 2,5-dimethyl-2,5-di(benzoylperoxy)hexane, t-butyl peroxyacetate, 2,2-di(t-butylperoxy)butane, t-butyl peroxybenzoate, n-butyl-4,4-di(t-butylperoxy) valerate, di(t-butylperoxyisopropyl)benzene, dicumyl peroxide, di(t-hexyl) peroxide, 2,5-dimethyl-2,5-di(t-butylperoxy)hexane, t-butylcumyl peroxide, di-t-butyl peroxide, p-menthane hydroperoxide, 2,5-dimethyl-2,5-di(t-butylperoxy)hexyne-3, diisopropylbenzene hydroperoxide, 1,1,3,3-tetramethylbutyl hydroperoxide, cumene hydroperoxide and t-butyl hydroperoxide.

Examples of the azo compound include 2,2'-azobis(4-methoxy-2,4-dimethylvaleronitrile, 2,2'-azobis(2,4-dimethylvaleronitrile), dimethyl 2,2'-azobis(2-methylpropionate), 2,2'-azobis(2-methylbutyronitrile), 1,1'-azobis(cyclohexane-1-carbonitrile), 2,2'-azobis[N-(2-propenyl)-2-methylpropionamide], 1-[(1-cyano-1-methylethyl)azo]formamide, 2,2'-azobis(N-butyl-2-methylpropionamide) and 2,2'-azobis(N-cyclohexyl-2-methylpropionamide).

The radical polymerization initiators may be used solely or in combination of two or more of them. The amount of the curing agent mixed is not particularly limited, and is preferably from 0.1 to 10 parts by mass, and more preferably from 0.5 to 5 parts by mass, per 100 parts by mass of the curable resin composition. In the case where the amount of the curing agent mixed is less than 0.1 part by mass, a sufficient curing rate may not be obtained, and in the case where the amount exceeds 10 parts by mass, there are cases where the final cured product becomes brittle to decrease the mechanical strength thereof.

[Additive]

To the curable resin composition of the invention, various additives such as an antioxidant, a lubricant and an ultraviolet ray absorbent may be added depending on necessity.

The antioxidant is not particularly limited, and products that are ordinarily used may be used. Among these, a phenol antioxidant, an amine antioxidant, a sulfur antioxidant, a phosphorus antioxidant and the like are preferred, and a phenol antioxidant and an amine antioxidant being radical chain inhibitors are more preferred, and a phenol antioxidant is particularly preferred. Examples of the phenol antioxidant include 2,6-di-t-butyl-p-cresol, 4,4-butylidenebis(6-t-butyl-3-methylphenol), 2,2'-methylenebis(4-methyl-6-t-butylphenol), 2,2'-methylenebis(4-ethyl-6-t-butylphenol), 2,6-di-t-butyl-4-ethylphenol, 1,1,3-tris(2-methyl-4-hydroxy-5-t-butylphenyl)butane, n-octadecyl-3-(3,5-di-t-butyl-4-hydroxyphenyl) propionate, tetrakis(methylene-3-(3,5-di-t-butyl-4-hydroxyphenyl)propionate)methane, triethylene glycol bis[3-(3-t-butyl-4-hydroxy-5-methylphenyl)propionate], tris(3,5-di-t-butyl-4-hydroxybenzyl)isocyanurate, 4,4-thiobis(6-t-butyl-3-methylphenol), 3,9-bis[2-[3-(3-t-butyl-4-hydroxy-5-methylphenyl)]-propionyloxy]-1,1'-dimethylethyl]-2,4,8,10-tetraoxa-spiro[5.5]undecane, thiodiethylenebis[3-(3,5-di-t-butyl-4-hydroxyphenyl) propionate], N,N'-hexan-1,6-diylbis[3-(3,5-di-t-butyl-4-hydroxyphenyl)-propionamide] and the like. Examples of the amino antioxidant include alkyldiphenylamine, N,N'-di-sec-butyl-p-phenylenediamine, N-phenyl-N'-1,3-dimethlbutyl-p-phenylenediamine and dialkylhydroxylamine. Examples of the sulfur antioxidant include dilauryl-3,3'-thiodipropionate, ditridecyl-3,3'-thiodipropionate, dimyristyl-3,3'-thiodipropionate, distearyl-3,3'-thiodipropionate, pentaerythrityltetrakis (3-laurylthiopropionate) and the like. Examples of the phosphorus antioxidant include tris[2-[[2,4,8,10-tetra-t-butylbenzo[d,f][1,3,2]dioxa-phosphephin-6-yl]oxy]ethyl] amine, bis[2,4-bis(1,1-dimethylethyl)-6-methylphenyl]ethyl ester phosphite and tetrakis(2,4-di-t-butylphenyl)[1,1-biphenyl]-4,4'-diyl bisphonate. The antioxidants may be used solely or in combination of two or more of them.

The lubricant is not particularly limited, and products that are ordinarily used may be used. Among these, a metallic soap lubricant, a fatty acid ester lubricant, an aliphatic hydrocarbon lubricant and the like are preferred, and a metallic soap lubricant is particularly preferred. Examples of the metallic soap lubricant include barium stearate, calcium stearate, zinc stearate, magnesium stearate and aluminum stearate. These may be used as a composite.

The ultraviolet ray absorbent is not particularly limited, and products that are ordinarily used may be used. Among these, a benzophenone ultraviolet ray absorbent, a benzotriazole ultraviolet ray absorbent and a cyanoacrylate ultraviolet ray absorbent are preferred, and a benzophenone ultraviolet ray absorbent is particularly preferred. Examples of the benzophenone ultraviolet ray absorbent include 2-(2'-hydroxy-5'-methyphenyl)benzotriazole, 2-(2'-hydroxy-5'-butylphenyl)benzotriazole and 2-(2-hydroxy-3'-t-butylphenyl) benzotriazole.

The additives are not limited to the aforementioned specific examples and, as the other additives, a defoaming agent, leveling agent, a releasing agent, a water repellent, a flame retarder, a contraction preventing agent and a crosslinking assistant and the like may be used for improving hardness, strength, moldability, durability and water resistance unless the objects and advantages of the invention are impaired.

[Solvent]

In the invention, a solvent is preferably used for effectively releasing the layers of the synthetic smectite for dispersing in the curable resin composition. Examples of the solvent include an aromatic hydrocarbon compound such as benzene, toluene, xylene, ethylbenzene, mesitylene, n-propylbenzene and isopropylbenzene; an acetate ester compound such as methyl acetate, ethyl acetate, propyl acetate and butyl acetate; a ketone compound such as acetone, methyl ethyl ketone and methyl isobutyl ketone; an ether compound such as diethyl ether, tetrahydrofuran and 1,4-dioxane; an alcohol compound such as methanol, ethanol, (iso)propanol and butyl alcohol; a halogenated hydrocarbon compound such as chloroform and methylene chloride; a nitrogen-containing solvent such as N,N-dimethylformamide, N-methylpyrrolidone, pyridine and acetonitrile; and the like. Preferred examples thereof include water, an alcohol compound such as methanol, toluene, xylene and N-methylpyrrolidone.

The proportion of the solvent to the synthetic smectite varies largely depending on the kind of the solvent, and is from 100 to 10,000 parts by mass, and more preferably from 200 to 5,000 parts by mass, per 100 parts by mass of the synthetic smectite. In the case where the proportion of the solvent is less than 100 parts by mass, the viscosity of the mixture liquid is increased to make it difficult to mix uniformly.

[Method for Mixing of the Curable Resin Composition]

The mixture of the synthetic smectite, the curable resin composition and the solvent can be produced, for example, by (1) a method of mixing a solution containing the resin component dissolved in a solvent and a dispersion liquid containing the synthetic smectite dispersed in a solvent, (2) a method of adding and dissolving the resin component directly to a dispersion liquid containing the synthetic smectite dispersed in a solvent, (3) a method of adding and dispersing the synthetic smectite to the resin component having been dissolved in a solvent, or (4) a method of dissolving and dispersing a mixture obtained by heating and kneading the resin component and the synthetic smectite in a solvent. Among these, such a method is particularly preferred that a solution containing the resin component dissolved in a solvent and a dispersion liquid containing the synthetic smectite dispersed in a solvent are mixed, from the standpoint of dispersibility of the synthetic smectite. The dispersing method is not particularly limited, and a known method may be used, such as a heating treatment, Mixrotor, a magnetic stirrer, a homogenizer, a Henschel mixer, a beads mill, an ultra-high pressure atomizing device and application of ultrasonic wave.

The dispersion liquid of the synthetic smectite, the curable resin composition and the solvent is depressurized for deaeration and concentration, whereby the viscosity of the dispersion liquid is controlled to a viscosity that is optimum for coating. The viscosity of the dispersion liquid is not particularly limited, but it is preferred that the viscosity is suitable for the forming method. For example, in the case of a roll coating method and a doctor knife coating method, the viscosity is preferably in a range of from 0.01 to 1,000 Pa·s at 25° C. A viscosity of less than 0.01 Pa·s or exceeding 1,000 Pa·s is not preferred since the workability is deteriorated. In the case where the viscosity is too high at ordinary temperature, the workability can be improved by increasing the temperature of the dispersion liquid. In the case where the depressurizing time is short, gaseous matters in the dispersion liquid cannot be sufficiently removed and form bubbles upon coating, drying and curing steps, thereby failing to provide a smooth transparent film.

The cured resin film of the present invention can be produced by a first step of applying a curable resin composition onto a surface of a first substrate and a surface of a second substrate respectively; a second step of bonding the curable resin composition layers provided on each surface of the first and second substrates to each other; and a third step of curing the curable resin composition layer between the first and the second substrates.

In the applying process (first process), the dispersion liquid having been deaerated and controlled in viscosity by concentrating under reduced pressure is used as a coating composition, and is coated on a smooth substrate such as glass, metal and a plastic film by a method that is ordinarily employed industrially, such as a direct gravure method, a reverse gravure method, a microgravure method, a roll coating method such as a two-roll bead coating method and a bottom feed three-roll reverse coating method, a doctor knife coating method, a die coating method, a dip coating method, a bar coating method, a coating method combining these methods, and the like. Among these, a roll coating method and a doctor knife coating method are preferred since these methods apply a force functioning in parallel to the substrate (shearing force) for orienting the synthetic smectite in the plane direction. The term "orienting in the plane direction" means that most of the synthetic smectite is oriented in parallel to the surface of the substrate. In the case where the synthetic smectite layers are oriented in the plane direction, the coefficient of thermal expansion of the transparent film in the plane direction can be effectively decreased. Furthermore, the layers of the synthetic smectite are oriented in the plane direction, whereby the total light transmittance is high even if the content of the synthetic smectite is large.

In the case where a solvent that is capable of being evaporated is used for dispersing the synthetic smectite and for controlling the viscosity, the synthetic smectite can be further oriented in the plane direction. Specifically, the mixture of the synthetic smectite, the curable resin composition and the solvent is applied on the substrate, and then only the solvent is evaporated, whereby the coating composition is contracted only in the thickness direction, thereby further orienting the synthetic smectite in the plane direction in the resin. In the case where the reactive monomer is used, it is preferred that a reactive monomer that has relatively low volatility is used in combination with a solvent having high volatility, and the solvent is dried under suitable conditions (such as temperature, pressure and time). The method of orienting the synthetic smectite in the plane direction by evaporating the solvent can be employed in combination with the roll coating method and/or the doctor knife coating method mentioned above, but a coating method without application of shearing force may be employed solely.

The temperature, at which the solvent is evaporated, is preferably from 0 to 200° C. A temperature of lower than 0° C. is not preferred since the evaporation speed becomes significantly lowered. A temperature exceeding 200° C. is not preferred since bubbling of the solvent due to rapid evaporation and boiling or gelation of the resin occurs, which results in possibilities of decrease in surface smoothness and increase in haze value. The temperature is more preferably from 10 to 100° C. The pressure, at which the solvent is evaporated, is preferably from 10 Pa to 1 MPa. A pressure of lower than 10 Pa is not preferred since bumping may occur, which results in possibilities of decrease in surface smoothness and increase in haze value. The pressure is more preferably from 10 to 200 Pa. The period of time for evaporating the solvent is preferably from 1 to 120 minutes. In the case where the period is less than 1 minute, the solvent cannot be sufficiently evaporated, thereby forming bubbles upon curing. A period of time exceeding 120 minutes is not preferred since the productivity is decreased. Upon evaporating the solvent, the solvent may be dried while allowing the gas such as air, nitrogen, argon and carbon dioxide to pass through. The gas may contain an evaporated component of the solvent. The flow rate of the gas upon evaporating the solvent is preferably from 0.01 to 200 m/s. A flow rate of less than 0.01 m/s is not preferred since the evaporated component of the solvent is accumulated. A flow rate exceeding 200 m/s is not preferred since the coating composition becomes heterogeneous. The flow rate is more preferably from 0.1 to 50 m/s.

In the step of bonding (second step), it is essential to stick and bond the curable resin composition layers provided on each surface of the first and second substrates to each other with a laminating machine and the like. The temperature of the heating roller of the laminating machine is preferably 0 to 200° C. When the curable resin after the application and drying is solid, it is preferable to heat the resin to above the melting point. When the substrate film has a Tg temperature, the heating must be conducted below the Tg temperature. The velocity of laminating (feeding) is preferably 0.01 to 100 m/min.

The process of curing the curable resin composition layer between the first and the second substrates (third process) is a process of curing the bonded body after the second process either by EB irradiation, UV irradiation, IR irradiation or heating. A transparent film can be obtained by releasing a cured film from the substrate after curing. In the case where the composition is not sandwiched with the smooth substrates such as glass, metal and a plastic film, the composition is cured with EB irradiation, UV irradiation, IR irradiation or heating in an inert gas (such as nitrogen, argon and carbon dioxide) atmosphere, followed by releasing from the substrate, to obtain a transparent film. Examples of the method include a method, in which the vinyl ester resin composition before curing having the synthetic smectite dispersed therein and containing the solvent is coated on a plane having a smooth surface, for example, a biaxially stretched polyethylene terephthalate film, in the aforementioned method, then the solvent is evaporated, sandwiched with biaxially stretched polyethylene terephthalate films having a smooth surface, and cured with any one of EB irradiation, UV irradiation, IR irradiation or heating. The curing method is preferably EB curing from the standpoint of curing rate and coloration.

In the case where the curable resin composition is cured with EB, a polymerization initiator is not necessary. In the case where the composition is completely cured by after-curing, however, a thermal polymerization initiator may be used in combination. The electron beam acceleration voltage upon EB irradiation is from 30 to 500 kV, and preferably from 50 to 300 kV. The electron beam irradiation dose is from 1 to 300 kGy, and preferably from 5 to 200 kGy. In the case where the electron beam acceleration voltage is less than 30 kV, shortage of the transmitted electron beam may occur when the composition has a large thickness, and in the case where it exceeds 500 kV, the operation is economically deteriorated. An electron beam irradiation dose exceeding 300 kGy is not preferred since the substrate may be damaged.

In the case where the curable resin composition is cured with UV, the curing temperature is from 0 to 150° C., and preferably from 10 to 130° C. The UV irradiation time is from 0.01 to 10 hours, preferably from 0.05 to 1 hour, and further preferably from 0.1 to 0.5 hour. The UV accumulated light amount is from 10 to 5,000 mJ/cm$^2$. An accumulated light amount is less than 10 mJ/cm$^2$ is not preferred since the composition may be insufficiently cured. An accumulated light amount exceeding 5,000 mJ/cm$^2$ may decrease the productivity.

Examples of a method of curing a curable resin composition by heating include heating by hot-air, heating by IR irradiation and combination of the hot-air heating and IR irradiation. Heat-curing temperature is from 30 to 200° C., and preferably from 40 to 180° C., and the curing time is from 0.05 to 100 hours, and preferably from 0.1 to 50 hours.

Upon EB irradiation, UV irradiation or IR irradiation, it is preferable to apply almost the same amount of light from the side of the first substrate and that of the second substrate. It is more preferable to irradiate the substrate from the both of the first substrate side and the second substrate side simultaneously. In the hot-air heating, it is preferable to apply almost the same amount of heat from the side of the first substrate and that of the second substrate.

In the case where the curing is found to be insufficient in the cured resin product after curing by EB irradiation, UV irradiation, IR irradiation or heating, the curing can be completely accomplished by after-curing. Upon performing the after-curing, the transparent film may be released from the smooth substrate such as glass, metal and a plastic film, or may not be released therefrom. The temperature for the after-curing is from 50 to 300° C., and preferably from 80 to 250° C. The period of time for the after-curing is from 0.1 to 10 hours, and preferably from 0.5 to 5 hours. The pressure for the after-curing may be a depressurized or pressurized atmosphere of from $1.0 \times 10^{-7}$ Pa to 1 MPa, and preferably from $1.0 \times 10^{-6}$ Pa to 0.5 MPa. The atmosphere for the after-curing may be such atmospheres as air, nitrogen, argon and carbon dioxide, and a nitrogen atmosphere is preferred from the standpoint of decreasing coloration.

EXAMPLES

The invention will be described with reference to Synthesis Examples, Example and Comparative Examples below, but the invention is not limited to the description.

[Measurement of Coefficient of Thermal Expansion and Tg]

The coefficient of thermal expansion was measured with TMA/SS6100, produced by SII NanoTechnology Inc., in a tensile mode. A test piece in a film form had a thickness of 100 μm×3 mm×12 mm (chuck distance: 10 mm) and was applied with a tension of 0.001 kgf, the temperature of which was increased to 250° C. at a temperature increasing rate of 5° C. per minute in an atmosphere containing 100 mL/min of nitrogen and then decreased to 50° C., and the elongation rate of the test piece was measured by again increasing the temperature from 50° C. to 250° C. at a temperature increasing rate of 5° C. per minute. The average coefficient of thermal expansion in the plane direction within a range of from 50 to 250° C. was calculated from the difference in elongation between 50° C. and 250° C. and the temperature difference (200° C.). The temperature of the discontinuous point in elongation rate was designated as the glass transition temperature (Tg).

[Total Light Transmittance]

The total light transmittance was measured with an automatic haze meter, TC-H3DPK, produced by Tokyo Denshoku Co., Ltd., according to JIS K7361-1.

[Haze]

The haze value was measured with an automatic haze meter, TC-H3DPK, produced by Tokyo Denshoku Co., Ltd., according to JIS K7136.

[Warpage]

A film of 10 mm (short side) by 100 mm (long side) was hung in a vacuum oven and heated under vacuum of 0.1 kPa or lower at 200° C. for one hour. After cooling, the film was laid on a flat plate and one short side of the film was held and the height of the other short side (elevated portion) was measured. When the height (elevated portion) measures 5 mm or more, it was determined that warpage occurred.

Synthesis Example 1

Oligomer (1)

276.3 parts (parts by mass, hereinafter the same) of a hydrogenated bisphenol A epoxy resin ST-4000D (a trade name, epoxy equivalent: 725), produced by Tohto Kasei Co., Ltd., 202.5 parts of toluene and 0.19 part of 4-methoxyphenol (MEHQ: hydroquinone monomethyl ether) as a polymerization inhibitor were charged in a four-neck flask equipped with a thermostat, a stirrer, a Dimroth condenser and an air introducing tube, and the temperature was increased to 80° C. while dry air was blown (20 ml/min), followed by stirring until the mixture became homogeneous. After the mixture was homogeneous, 27.5 parts of acrylic acid, produced by Kuraray Co., Ltd., and 1.24 parts of benzyltriphenylphosphonium chloride (TPP-ZC, a trade name, produced by Hokko Chemical Industry Co., Ltd.) as a catalyst were added and reacted at a temperature controlled to 110° C. for 7 hours. The reaction was terminated at an acid value of 7.8 mgKOH/g to obtain an oligomer (1) (toluene solution).

Synthesis Example 2

Oligomer (2)

1,625 g of diallyl 1,4-cyclohexanedicarboxylate, 327 g of propylene glycol and 0.813 g of dibutyltin oxide were charged in a 2-L three-neck flask equipped with distillation apparatus, and heated under a nitrogen stream while distilling off alcohol formed at 180° C. At the time when the amount of the alcohol distilled off was about 350 g, the reaction system was gradually depressurized to 6.6 kPa (over about 4 hours) to accelerate the distillation speed of allyl alcohol. After the distillate was substantially not generated, the reaction system was depressurized to 0.5 kPa, and the reaction was further performed for 1 hour, followed by cooling the reaction product to room temperature. The reaction product thus obtained is referred to as an oligomer (2).

Example 1

24 g of toluene was placed in a 100-mL sample bottle, to which 3 g of oleophilic synthetic smectite (Smectite STN, produced by Co-op Chemical Co., Ltd., number average particle diameter: 50 nm, aspect ratio: 50, inorganic content: 71%) having been subjected to a cation exchanging treatment with trioctylmethylammonium salt was added little by little under stirring with a stirrer. After closing the sample bottle with a lid, the mixture was stirred with Mixrotor at room temperature for one day to obtain a smectite dispersion liquid. A toluene solution of the oligomer (1) (7 g in terms of resin amount) was added to the smectite dispersion liquid, and 0.35 g of an UV curing agent (Irgacure 186, produced by Ciba Specialty Chemicals Co., Ltd.) was added, followed by sufficiently stirring, to obtain a composition (1). The composition (1) was attached to an evaporator and stirred at room temperature under 20 kPa for 10 minutes for controlling the viscosity and removing the gaseous components in the composition.

The composition (1) was applied on a PET film (thickness: 50 μm) with a bar coater to a dry thickness of 50 μm. The composition was dried with a hot air dryer at 80° C. for 30 minutes to evaporate toluene as a solvent, the surfaces applied with the composition of the film and another film on which composition (1) was applied and dried in the same way were bonded to each other by a laminating machine. The temperature of the rubber roller of the laminating machine was 75° C., and the velocity of feeding was 0.3 m/min. The bonded film was cured by irradiating UV on the both sides of the bonded film at a UV irradiation intensity of 300 mJ/cm$^2$, and PET films on the both sides were released, thereby obtaining sample film (1). The linear expansion coefficient of the sample film was 13 ppm/° C. The total light transmittance thereof was 92%, and the haze thereof was 0.9%. A sample film was cut into 100-square-millimeter pieces and hung in a vacuum oven and heated under reduced pressure of 0.1 kPa or lower at 200° C. for one hour, and no deformation such as warpage was observed.

Example 2

A smectite dispersion liquid was obtained in the same manner as in Example 1. After adding 1.8 g of oligomer (2) and 1.2 g of 1,6-hexanediol diacrylate (manufactured by Shin-Nakamura Chemical Co., Ltd.) to the smectite dispersion liquid, 0.35 g of a UV curing agent (manufactured by Ciba Specialty Chemicals Inc.; IRGACURE651) was further added and fully mixed to prepare composition (2). The composition (2) was attached to an evaporator and stirred at room temperature under 20 kPa for 10 minutes for controlling the viscosity and removing the gaseous components in the composition.

The composition (2) was applied on a PET film (thickness: 50 μm) with a bar coater to a dry thickness of 50 μm. The composition was dried with a hot air dryer at 80° C. for 30 minutes to evaporate toluene as a solvent, the surfaces applied with the composition of the film and another film on which composition (2) was applied and dried in the same way were bonded to each other by a laminating machine. The temperature of the rubber roller of the laminating machine was 75° C., and the velocity of feeding was 0.3 m/min. The bonded film was cured by irradiating UV on the both sides of the bonded film at a UV irradiation intensity of 600 mJ/cm$^2$, and PET films on the both sides were released, thereby obtaining sample film (2). The linear expansion coefficient of the sample film was 15 ppm/° C. and Tg was not observed. The total light transmittance thereof was 92%, and the haze thereof was 1.2%. A sample film (2) was hung in a vacuum oven and heated under reduced pressure of 0.1 kPa or lower at 200° C. for one hour, and no deformation such as warpage was observed.

Example 3

The composition (1) was applied on a PET film (thickness: 50 μm) with a bar coater to a dry thickness of 50 μm. The composition was dried with a hot air dryer at 80° C. for 30 minutes to evaporate toluene as a solvent, the surfaces applied with the composition of the film and another film on which composition (1) was applied and dried in the same way, which surfaces are the side opposite to the substrate, were bonded to each other by a laminating machine. The temperature of the rubber roller of the laminating machine was 75° C., and the velocity of feeding was 0.3 m/min. The bonded film was cured by irradiating UV on one side of the bonded film at a UV irradiation intensity of 600 mJ/cm$^2$, and PET films on the both sides were released, thereby obtaining sample film (3). The linear expansion coefficient of the sample film was 13 ppm/° C. and Tg was not observed. The total light transmittance thereof was 92%, and the haze thereof was 0.8%. A sample film (3) was hung in a vacuum oven and heated under reduced pressure of 0.1 kPa or lower at 200° C. for one hour, and slight warpage (4 mm) was observed.

Comparative Example 1

The composition (1) was applied on a PET film (thickness: 50 μm) with a bar coater to a dry thickness of 100 μm. The composition was dried with a hot air dryer at 80° C. for 30 minutes to evaporate toluene as a solvent, only a PET film was bonded on the film surface applied with the composition with a laminating machine. The temperature of the rubber roller of the laminating machine was 75° C., and the velocity of feeding was 0.3 m/min. The bonded film was cured by irradiating UV on the bonded film at a UV irradiation intensity of 300 mJ/cm$^2$, and PET films on the both sides were released, thereby obtaining sample film (4). The linear expansion coefficient of the sample film was 13 ppm/° C. and Tg was not observed. The total light transmittance thereof was 92%, and the haze thereof was 0.8%. The obtained sample film (4) was hung in a vacuum oven and heated under reduced pressure of 0.1 kPa or lower at 200° C. for one hour, and warpage occurred and the whole film curled.

The invention claimed is:

1. A method for producing a cured film comprising a first step of applying a curable resin composition onto a surface of a first substrate and onto a surface of a second substrate to form first and second curable resin composition layers, respectively; a second step of bonding the first and second curable resin composition layers provided on each surface of the first and second substrates to each other to form a bonded curable resin composition layer; a third step of curing the bonded curable resin composition layer between the first and the second substrates; and a fourth step of removing the first and second substrates of the bonded curable resin composition from the cured layer, thereby forming a free-standing cured layer.

2. The method for producing a cured film as claimed in claim 1, wherein the curable resin composition contains a volatile solvent and/or a reactive monomer.

3. The method for producing a cured film as claimed in claim 1, comprising a step of drying the curable resin composition layer between the first and second steps.

4. The method for producing a cured film as claimed in claim 1, wherein the curable resin composition contains at least one member selected from a group consisting of allyl ester resin, (meth)acrylic resin and vinyl ester resin.

5. The method for producing a cured film as claimed in claim 1, wherein the curable resin composition contains a layered inorganic compound.

6. The method for producing a cured film as claimed in claim 5, wherein the layered inorganic compound is a synthetic smectite.

7. The method for producing a cured film as claimed in claim 1, wherein the curing is conducted by at least one of an electron beam (EB) irradiation, an ultraviolet ray (UV) irradiation, an infrared ray (IR) irradiation and heating.

8. The method for producing a cured film as claimed in claim 7, wherein the curable resin composition layer between the first and second substrates is cured by being irradiated by electron beam (EB), ultraviolet ray (UV) or infrared ray (IR) with almost the same exposure from the side of the first substrate and that of the second substrate.

9. The method for producing a cured film as claimed in claim 7, wherein the curing by heating is conducted by applying almost the same amount of heat to the curable resin composition layer between the first and second substrates from the side of the first substrate and that of the second substrate.

* * * * *